(12) United States Patent
Yen et al.

(10) Patent No.: US 12,739,988 B2
(45) Date of Patent: Sep. 15, 2026

(54) CENTRAL HOUSING OF FOLDABLE ELECTRONIC DEVICE FOR PIVOTALLY CONNECTING PIVOTING MODULES

(71) Applicant: SYNCMOLD ENTERPRISE CORP., New Taipei City (TW)

(72) Inventors: Ching-Hui Yen, New Taipei City (TW); Chien-Cheng Yeh, New Taipei City (TW); Chun-Hao Huang, New Taipei City (TW)

(73) Assignee: SYNCMOLD ENTERPRISE CORP., New Taipei City (TW)

( * ) Notice: Subject to any disclaimer, the term of this patent is extended or adjusted under 35 U.S.C. 154(b) by 86 days.

(21) Appl. No.: 18/904,116

(22) Filed: Oct. 2, 2024

(65) Prior Publication Data

US 2025/0194029 A1 Jun. 12, 2025

Related U.S. Application Data

(60) Provisional application No. 63/607,236, filed on Dec. 7, 2023.

(30) Foreign Application Priority Data

Jun. 24, 2024 (TW) ................................ 113123447

(51) Int. Cl.
*H05K 5/00* (2025.01)
*H05K 5/02* (2006.01)

(52) U.S. Cl.
CPC ................................ *H05K 5/0226* (2013.01)

(58) Field of Classification Search
CPC ... H05K 5/0226; G06F 1/1681; G06F 1/1616; G06F 1/1675; G06F 2203/04102; H04M 1/022; H04M 1/0216; G09F 9/301
See application file for complete search history.

(56) References Cited

U.S. PATENT DOCUMENTS

| | | | | |
|---|---|---|---|---|
| 11,294,431 | B2 * | 4/2022 | Torres | G06F 1/1681 |
| 11,336,759 | B2 * | 5/2022 | Liao | H04M 1/022 |
| 11,408,214 | B1 * | 8/2022 | Hsu | H04M 1/022 |
| 11,681,335 | B1 * | 6/2023 | Hsu | G06F 1/1681 361/679.01 |
| 11,703,916 | B2 * | 7/2023 | Tian | G06F 1/1616 361/679.27 |
| 12,130,668 | B2 * | 10/2024 | Liu | G09F 9/301 |
| 12,242,309 | B2 * | 3/2025 | Hyun | G06F 1/1647 |
| 12,256,508 | B2 * | 3/2025 | Zhang | G09F 9/301 |
| 12,306,671 | B2 * | 5/2025 | Caplow-Munro | G06F 1/1641 |
| 12,314,091 | B2 * | 5/2025 | Cheng | H04M 1/022 |
| 12,360,575 | B2 * | 7/2025 | Lin | G06F 1/1681 |

(Continued)

FOREIGN PATENT DOCUMENTS

CN 112333308 2/2021

*Primary Examiner* — Rockshana D Chowdhury

(74) *Attorney, Agent, or Firm* — Amin, Turocy & Watson, LLP

(57) ABSTRACT

A central housing of a foldable electronic device is provided for pivotally connecting at least one first pivoting module and at least one second pivoting module. The central housing of the foldable electronic device includes at least two base shell units and at least one connecting shell unit. The connecting shell unit is connected to any two of the base shell units, and the base shell units and the connecting shell unit are integrally formed.

11 Claims, 7 Drawing Sheets

(56) References Cited

U.S. PATENT DOCUMENTS

| | | | | |
|---|---|---|---|---|
| 12,429,925 | B2 * | 9/2025 | Zhang | G06F 1/1616 |
| 12,468,352 | B2 * | 11/2025 | Zhang | F16C 11/04 |
| 12,477,049 | B2 * | 11/2025 | Taketomi | F16C 11/04 |
| 12,481,332 | B2 * | 11/2025 | Sun | G06F 1/1616 |
| 12,481,333 | B2 * | 11/2025 | Yang | F16C 11/10 |
| 12,487,644 | B2 * | 12/2025 | Park | G06F 1/1681 |
| 12,498,769 | B2 * | 12/2025 | Cheng | G06F 1/1681 |
| 12,507,360 | B2 * | 12/2025 | Kim | F16C 11/10 |
| 12,541,230 | B2 * | 2/2026 | Liao | G06F 1/1681 |
| 12,542,839 | B2 * | 2/2026 | Dong | H04M 1/022 |
| 2020/0204666 | A1 * | 6/2020 | Hong | G06F 1/203 |
| 2021/0034116 | A1 * | 2/2021 | Torres | G06F 1/1681 |
| 2021/0034117 | A1 * | 2/2021 | Torres | E05D 3/06 |
| 2023/0050832 | A1 * | 2/2023 | Yang | H04M 1/022 |
| 2023/0053947 | A1 * | 2/2023 | Liu | G06F 1/1652 |
| 2023/0102766 | A1 * | 3/2023 | Huang | H04M 1/0216 |
| | | | | 455/575.3 |
| 2024/0219978 | A1 * | 7/2024 | Nagai | F16C 11/04 |
| 2024/0241552 | A1 * | 7/2024 | Zhang | F16C 11/04 |
| 2024/0247683 | A1 * | 7/2024 | Hong | F16C 11/04 |

* cited by examiner

CENTRAL HOUSING OF FOLDABLE ELECTRONIC DEVICE FOR PIVOTALLY CONNECTING PIVOTING MODULES

CROSS-REFERENCE TO RELATED APPLICATIONS

This application claims the benefit of U.S. Provisional Application Ser. No. 63/607,236 filed on Dec. 7, 2023, and the benefit of Taiwan Patent Application Serial No. 113123447 filed on Jun. 24, 2024. The entirety of each Application is incorporated herein by reference.

BACKGROUND

1. Technical Field

The present disclosure provides a central housing of a foldable electronic device, and more particularly, a central housing of a foldable electronic device with a reduced thickness.

2. Description of Related Art

CN112333308 discloses a foldable device, which includes a connecting mechanism, two rotating mechanisms and a supporting mechanism, wherein the connecting mechanism includes a strip-shaped connecting frame and a connecting component provided on the connecting frame, two opposite sides of the connecting component respectively rotate to connect the rotating mechanisms, and a supporting mechanism is connected between each rotating mechanism and the connecting component. Specifically, a first positioning column, a clamping column and a second positioning column of the connecting frame are respectively inserted into the corresponding connecting hole, clamping hole and positioning hole of the connecting component, and then are locked respectively with locking members, for example, screw is inserted into the connecting hole to lock in the positioning hole of the first positioning column.

However, in order to lock the connecting frame (i.e., the central shell) and the connecting component to each other by screws, the connecting component must have a certain thickness and strength to withstand the stress exerted when the screws are locked, otherwise there is a risk on the rupture of the connecting component. Besides, a thread space must be reserved in the connecting frame for screws to be locked, so the thickness of the connecting frame cannot be reduced. Therefore, the thickness of most foldable devices (such as foldable cell phones) on the market is greater than 10 mm, so how to make a foldable device have the thickness less than 10 mm with sufficient strength is a direction worthy of research and development.

SUMMARY

The present disclosure provides a central housing of a foldable electronic device, which is provided for pivotally connecting at least one first pivoting module and at least one second pivoting module, the central housing of the foldable electronic device comprises: at least two base shell units, each of the base shell units includes a body block, a track block, at least one first inner arc-shaped slider and at least one second inner arc-shaped slider, the track block extends outward from a side of the body block along a first direction, the first inner arc-shaped sliders and the second inner arc-shaped sliders are respectively formed on the body block at intervals from each other, the first pivoting module pivots relative to the body block via the first inner arc-shaped sliders, and the second pivoting module pivots relative to the body block via the second inner arc-shaped sliders; and at least one connecting shell unit connected to any two of the base shell units, wherein the base shell units and the connecting shell unit are integrally formed.

In the aforementioned central housing of the foldable electronic device, the body block has a first protruding portion and a second protruding portion spaced apart from each other, the second protruding portion is located between the first protruding portion and the track block and is adjacent to the track block, the connecting shell unit is connected to a side of the first protruding portion away from the second protruding portion or is connected to a side of the second protruding portion away from the first protruding portion, and the track blocks are respectively formed on the connecting shell unit.

In the aforementioned central housing of the foldable electronic device, each of the first protruding portions has a first left surface and a first right surface, each of the second protruding portions has a second left surface and a second right surface, the first left surface faces the second left surface, and the first right surface faces the second right surface, wherein the first inner arc-shaped sliders extend outward from the first left surface and the second left surface respectively and correspond to each other, and the second inner arc-shaped sliders extend outward from the first right surface and the second right surface respectively and correspond to each other.

In the aforementioned central housing of the foldable electronic device, each of the base shell units further includes two axial holes, and the axial holes are respectively recessed on the second protruding portion along a first axis and a second axis parallel to the first direction.

In the aforementioned central housing of the foldable electronic device, each of the base shell units further includes a track groove, and the track groove penetrates through the track block.

In the aforementioned central housing of the foldable electronic device, each of the track blocks has a track section and two wing sections, the wing sections respectively extend outward from opposite sides of the corresponding track section, and the track groove is correspondingly located in the track section.

In the aforementioned central housing of the foldable electronic device, a thickness of each of the track sections is greater than a thickness of the corresponding wing sections.

In the aforementioned central housing of the foldable electronic device, the connecting shell unit and the base shell units are formed by a 3D printing process.

The aforementioned central housing of the foldable electronic device further comprises a continuous bottom surface, wherein each of the base shell units further includes a base bottom surface, the connecting shell unit includes a connecting bottom surface, and the base bottom surfaces and the connecting bottom surface are connected to each other to commonly form the continuous bottom surface.

In the aforementioned central housing of the foldable electronic device, the connecting shell unit has a roughly U-shaped cross section.

In the aforementioned central housing of the foldable electronic device, each of the base shell units further includes a screw lock hole.

In the aforementioned central housing of the foldable electronic device, a height of the connecting shell unit is less than a height of any of the base shell units.

To sum up, by means that the base shell units and the connecting shell unit are integrally formed, so the overall strength can be provided by the base shell units and the connecting shell unit, respectively. Therefore, the thickness of the central housing of the foldable electronic device of the present disclosure can be reduced to less than 10 mm, and the central housing has sufficient strength, so as to avoid the problem in the prior art that the thread space must be reserved and the thickness cannot be reduced.

DETAILED DESCRIPTION

Figure 1:
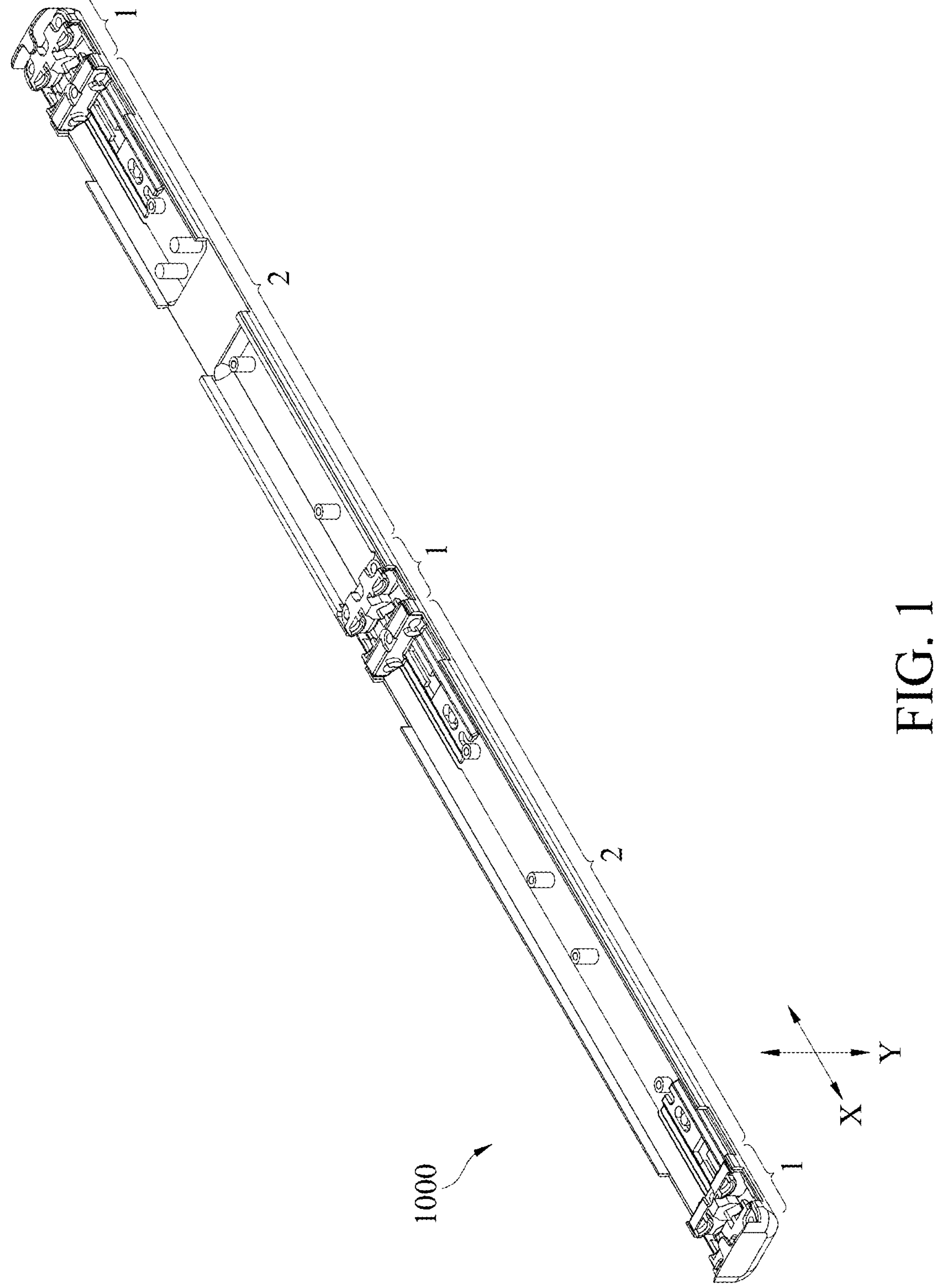
FIG. 1 is an overall schematic view of the central housing of the foldable electronic device according to the present disclosure.
Figure 2:
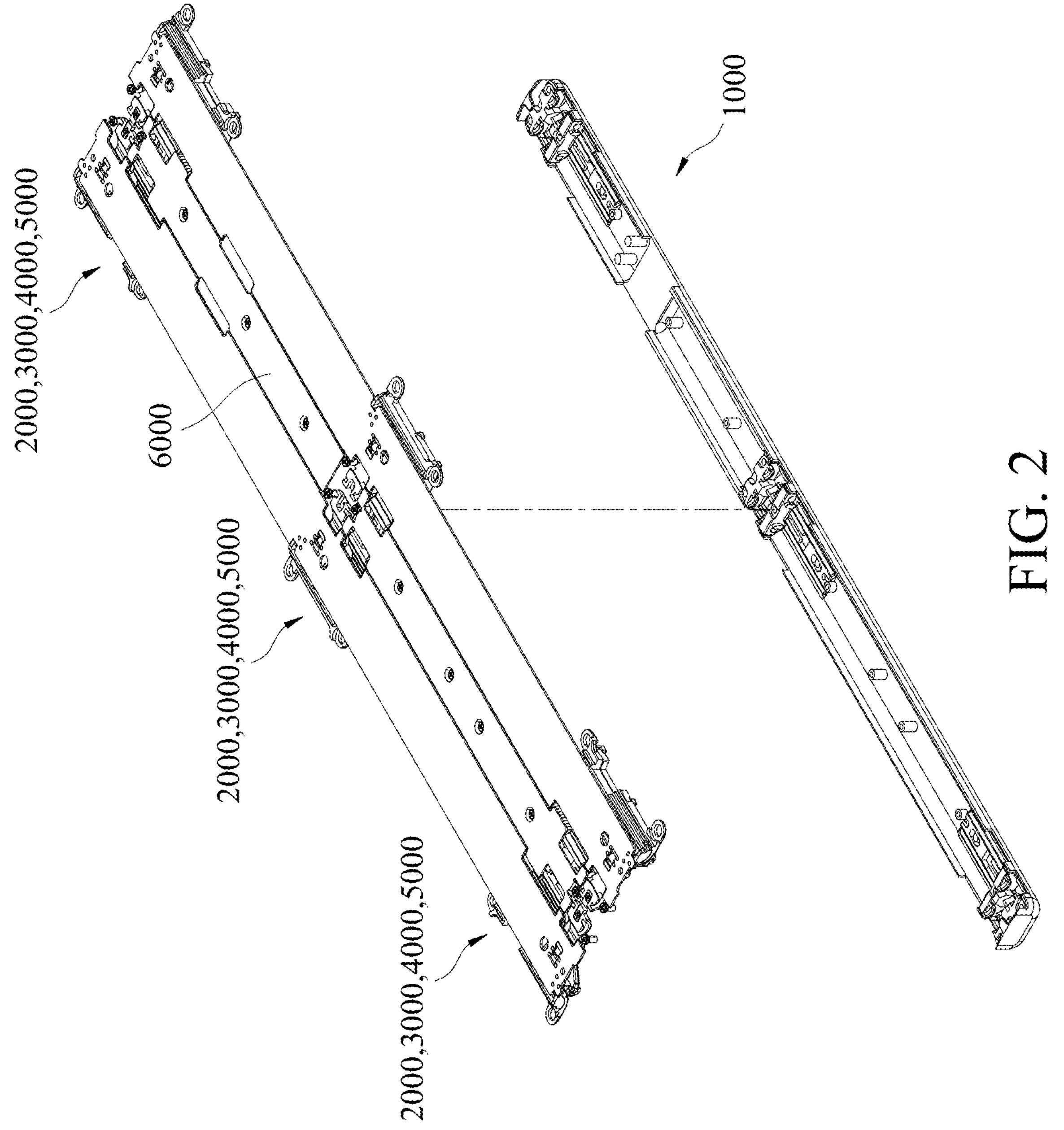
FIG. 2 is an exploded schematic view of the central housing, the first pivoting module and the second pivoting module of the foldable electronic device according to the present disclosure.
Figure 4:
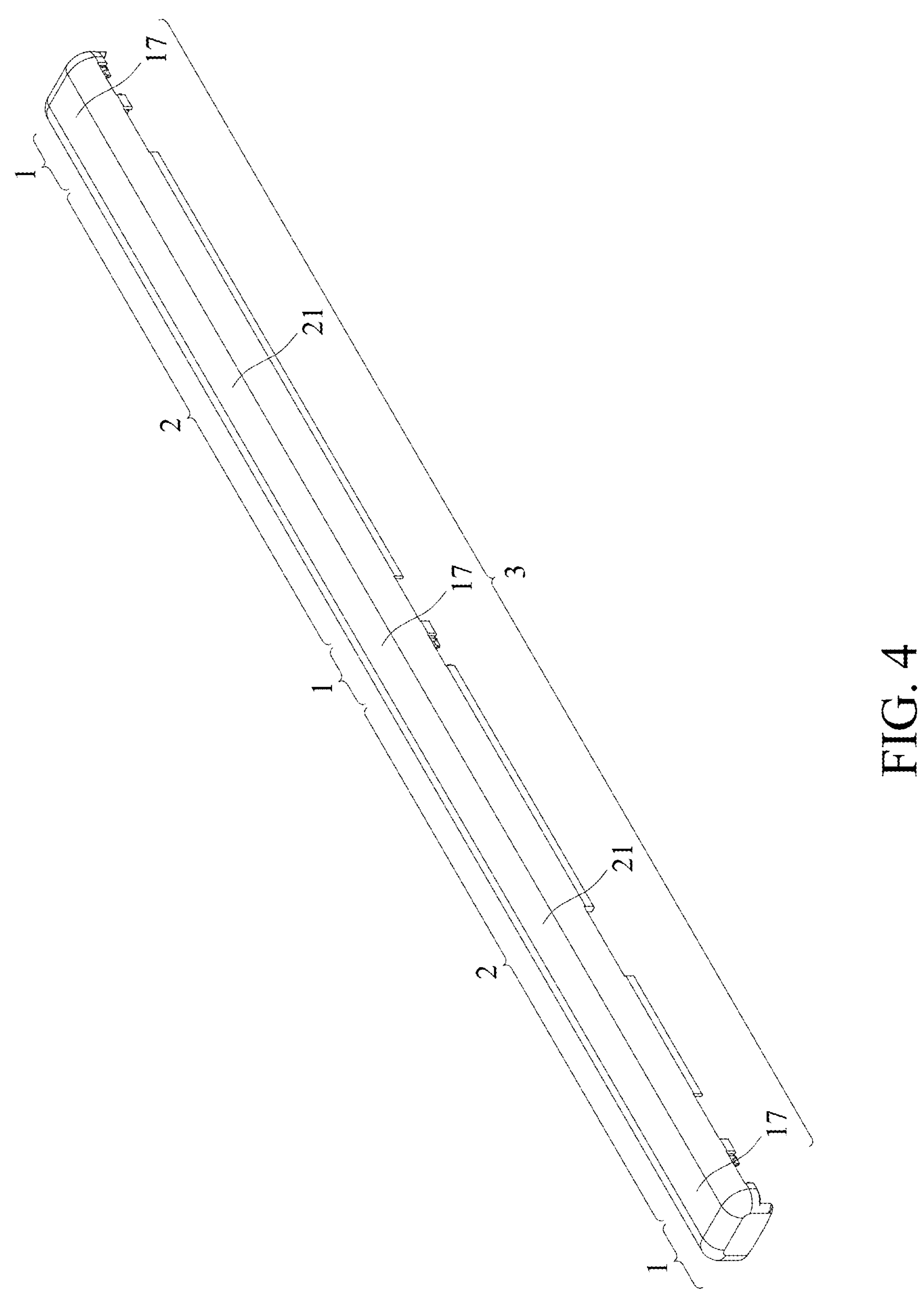
FIG. 4 is an overall schematic view of another perspective of the central housing of the foldable electronic device according to the present disclosure.

Please refer to FIG. 1, FIG. 2 and FIG. 4. A central housing 1000 of a foldable electronic device of the present disclosure is provided for pivotally connecting three first pivoting modules 2000, three second pivoting modules 3000, three torque modules 4000, three synchronization modules 5000 and one top plate 6000. The central housing 1000 of the foldable electronic device includes three base shell units 1, two connecting shell units 2 and one continuous bottom surface 3. Two ends of each of the connecting shell units 2 are respectively connected to any two of the base shell units 1 along a first direction X, and the continuous bottom surface 3 is composed of the base shell units 1 and the connecting shell units 2. Each of the first pivoting modules 2000 is respectively and pivotally connected to one side of the two opposite sides of each of the base shell units 1. Each of the second pivoting modules 3000 is respectively and pivotally connected to the other side of the two opposite sides of each of the base shell units 1. Each of the torque modules 4000 is respectively connected to each of the first pivoting modules 2000 and each of the second pivoting modules 3000, and is fixed to the connecting shell unit 2. Each of the synchronization modules 5000 is slidably connected between each of the first pivoting modules 2000 and each of the second pivoting modules 3000. The top plate 6000 is fixed to the base shell units 1 and the connecting shell units 2.

Figure 3:
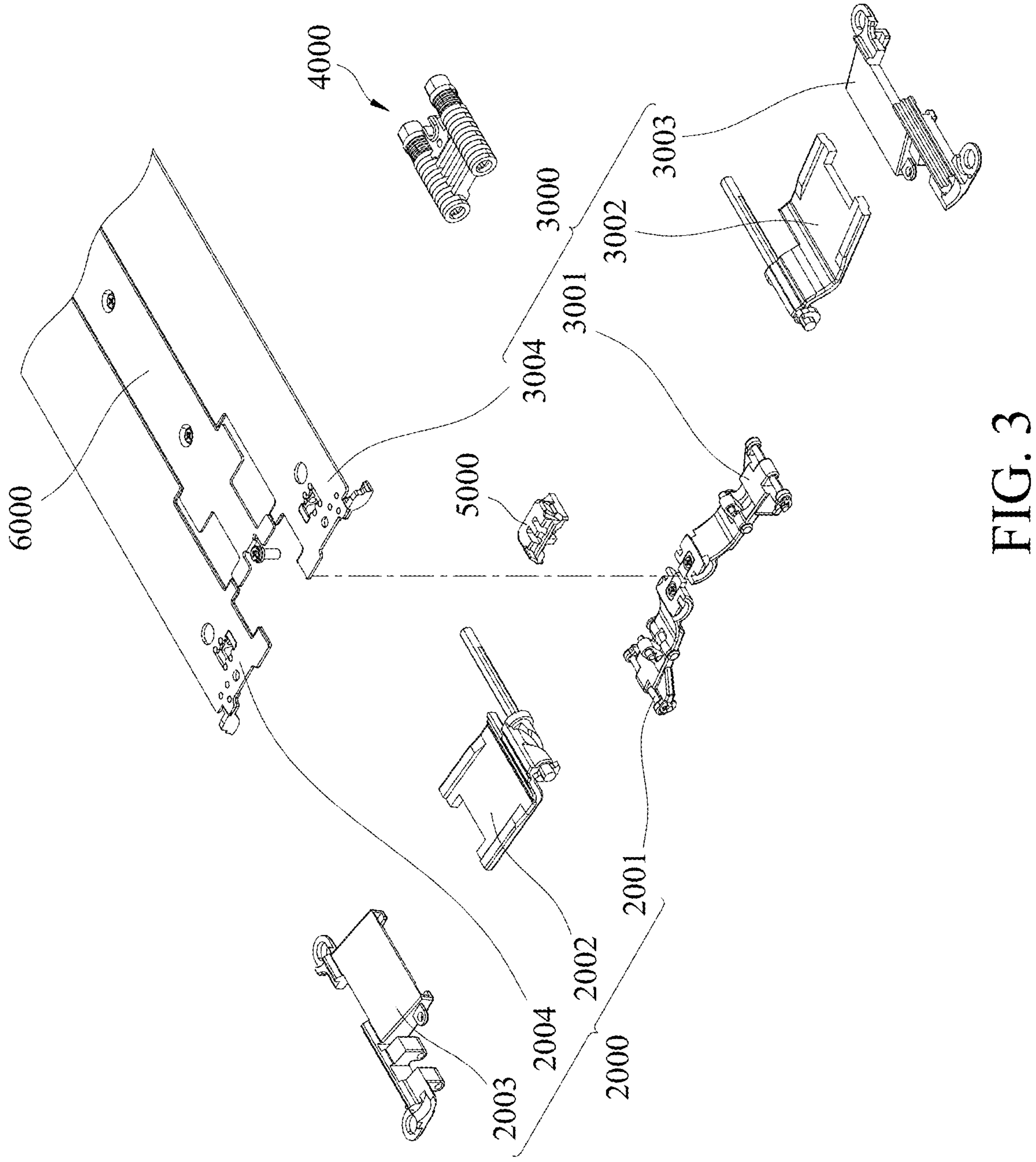
FIG. 3 is an exploded schematic view of the first pivoting module and the second pivoting module according to the present disclosure.

Please refer to FIG. 3. Each of the first pivoting modules 2000 includes a wing member 2001, a transmission member 2002, a panel body 2003 and a drop plate 2004. The wing member 2001 is pivotally connected to one side of the base shell unit 1, the transmission member 2002 is connected to the base shell unit 1 and the torque module 4000, the panel body 2003 is pivotally connected to the wing member 2001 and is connected to the transmission member 2002, and the drop plate 2004 is connected to the wing member 2001 and the panel body 2003. Each of the second pivoting modules 3000 includes a wing member 3001, a transmission member 3002, a panel body 3003 and a drop plate 3004. The wing member 3001 is pivotally connected to the other side of the base shell unit 1, the transmission member 3002 is connected to the base shell unit 1 and the torque module 4000, the panel body 3003 is pivotally connected to the wing member 3001 and is connected to the transmission member 3002, and the drop plate 3004 is connected to the wing member 3001 and the panel body 3003. In an embodiment, the plurality of first pivoting modules 2000 can commonly include a drop plate 2004, or can also respectively include a drop plate 2004, and the same applies to the second pivoting modules 3000, but not limited to the above.

Figure 5:
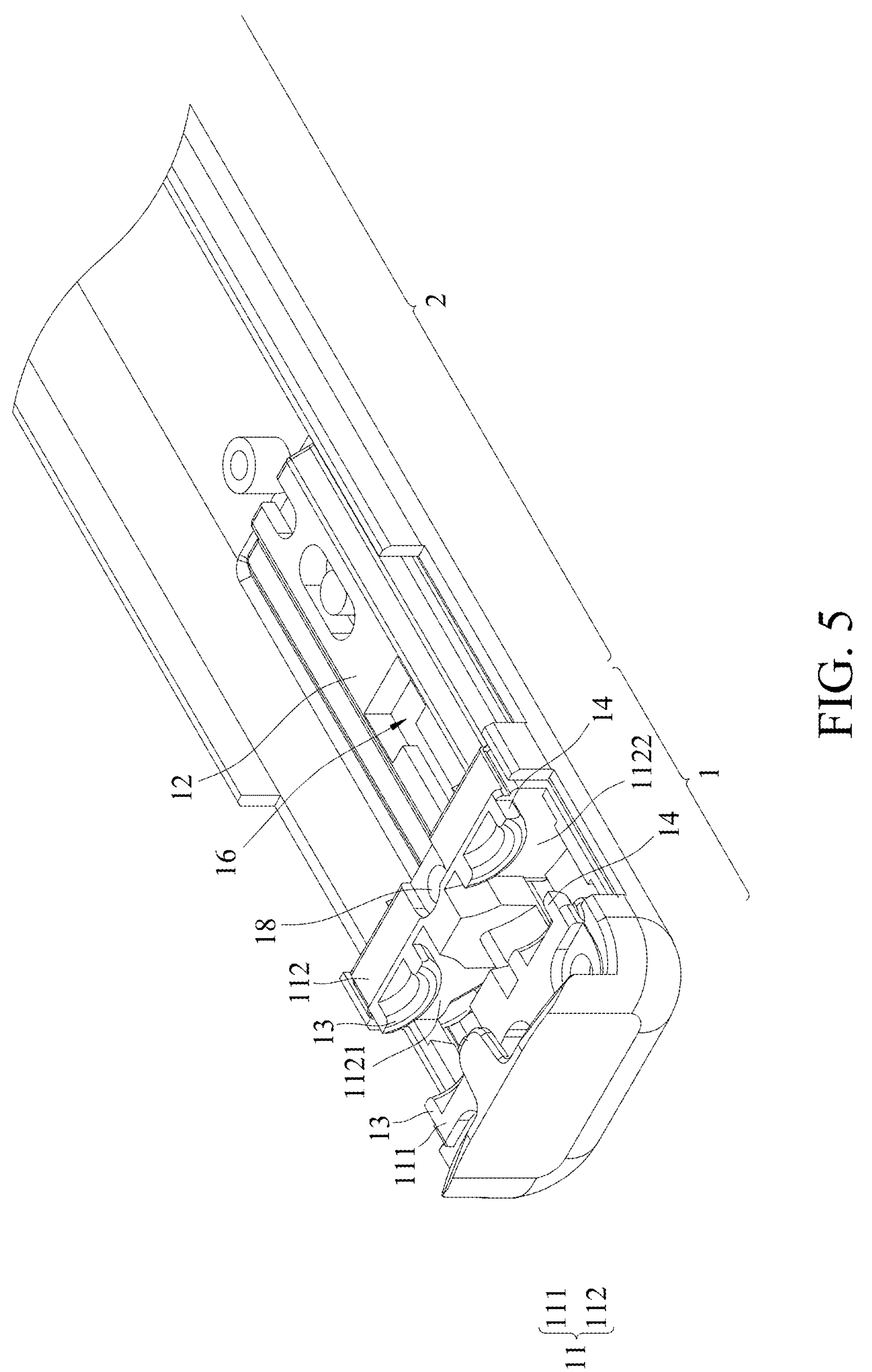
FIG. 5 and FIG. 6 are schematic views of different perspectives of the base shell unit in the central housing of the foldable electronic device according to the present disclosure.
Figure 6:
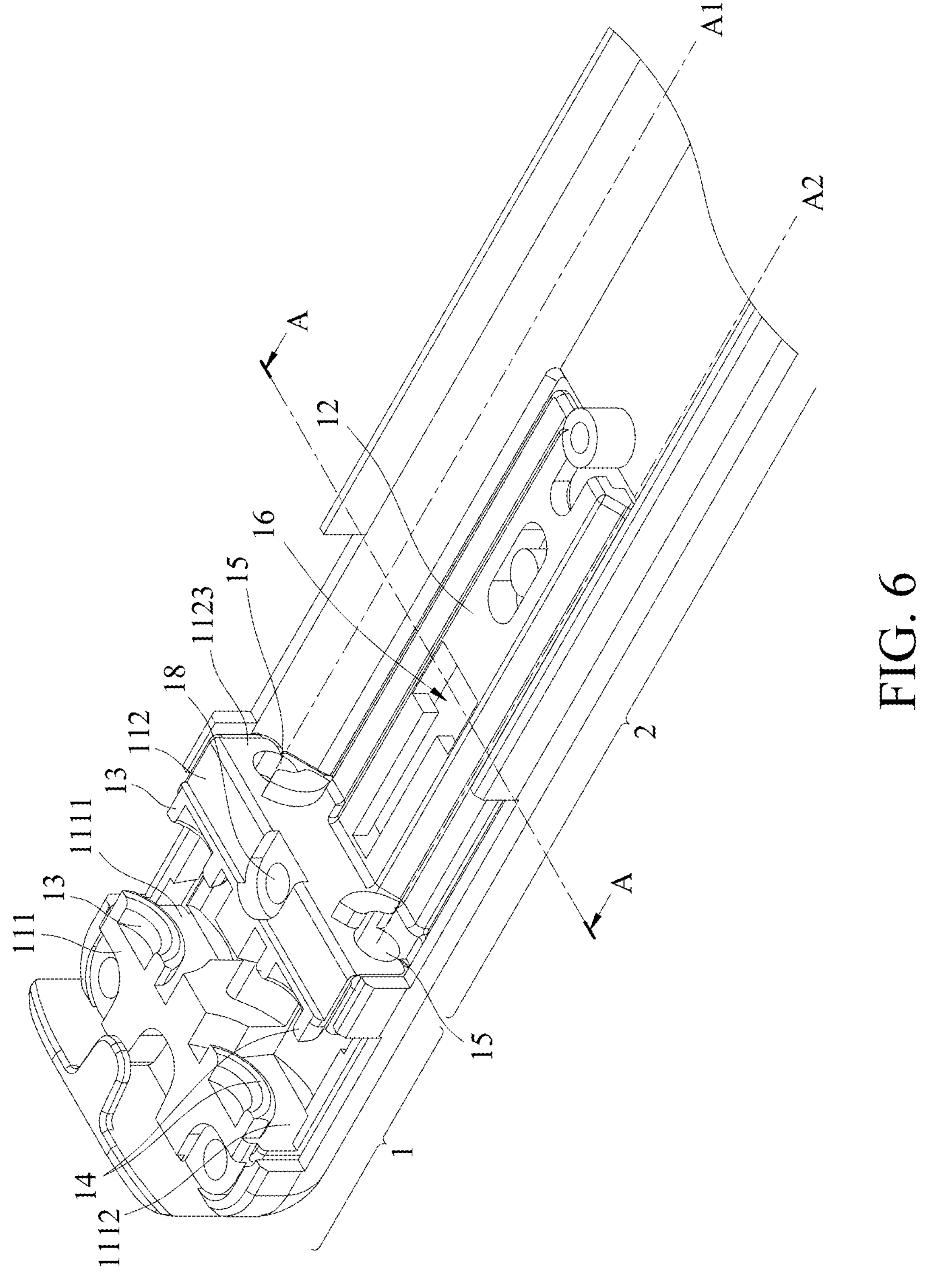

Please refer to FIG. 5 and FIG. 6. The base shell unit 1 includes one body block 11, one track block 12, two first inner arc-shaped sliders 13, two second inner arc-shaped sliders 14, two axial holes 15, one track groove 16, one base bottom surface 17 and one screw lock hole 18. The body block 11 has a first protruding portion 111 and a second protruding portion 112 spaced apart from each other, and the second protruding portion 112 is located between the first protruding portion 111 and the track block 12. The first protruding portion 111 has a first left surface 1111 and a first right surface 1112, and the second protruding portion 112 has a second left surface 1121, a second right surface 1122 and a second back surface 1123. The first left surface 1111 faces the second left surface 1121, the first right surface 1112 faces the second right surface 1122, and the second back surface 1123 faces away the second left surface 1121 and the second right surface 1122.

Figure 7:
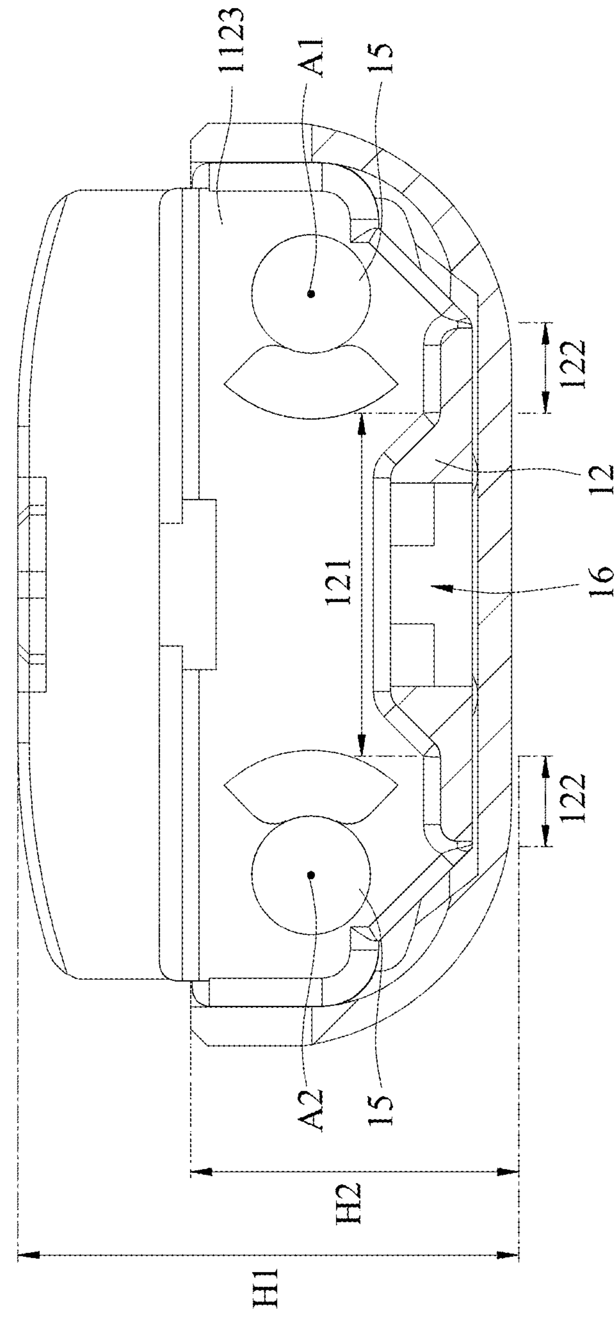
FIG. 7 is a schematic cross-sectional view along the A-A section line in FIG. 6.

Please also refer to FIG. 7. The track block 12 extends outward from the second back surface 1123 along the first direction X and is adjacent to the second protruding portion 112, and is correspondingly formed on the connecting shell unit 2. The track block 12 has one track section 121 and two wing sections 122. The track section 121 has a roughly trapezoidal cross section. The wing sections 122 extend outward from opposite sides of the corresponding track section 121 respectively. The thickness of the track section 121 is greater than the thickness of the wing sections 122.

The two first inner arc-shaped sliders 13 extend outward from the first left surface 1111 and the second left surface 1121 respectively, and are corresponding to and spaced apart from each other, and are roughly in a semi-arc shaped body. The wing member 2001 is slidably connected to the first inner arc-shaped sliders 13, whereby the wing member 2001 can pivot relative to the body block 11. The two second inner arc-shaped sliders 14 and the two first inner arc-shaped sliders 13 are spaced apart and extend outward from the first right surface 1112 and the second right surface 1122 respectively, and correspond to and are spaced apart from each other, and are roughly in a semi-arc shaped body. The wing member 3001 is slidably connected to the second inner arc-shaped sliders 14, whereby the wing member 3001 can pivot relative to the body block 11.

The two axial holes 15 are respectively recessed in the second back surface 1123 of the second protruding portion 112 along a first axis A1 and a second axis A2 parallel to the first direction X for pivotally placing the transmission members 2002, 3002 respectively. The track groove 16 penetrates through the track block 12 along a second direction Y perpendicular to the first direction X, and is correspondingly located on the track section 121 for the synchronization module 5000 to slidably place inside. The base bottom surface 17 faces away the body block 11. The screw lock hole 18 penetrates through the second protruding portion 112 along the second direction Y, and the top plate 6000 is fixed to the screw lock hole 18 via a screw.

The connecting shell unit 2 is connected to a side of the second protruding portion 112 away from the first protruding portion 111 (i.e., the connecting shell unit 2 is connected to the second back surface 1123), and has a roughly U-shaped cross section and a connecting bottom surface 21. The connecting bottom surface 21 and the base bottom surface 17 are connected to each other. The connecting shell unit 2 can also be connected to a side of the first protruding portion 111 away from the second protruding portion 112. In other words, each of the base shell units 1 can be arranged along the same direction, so a single connecting shell unit 2 is connected to the first protruding portion 111 and the second protruding portion 112 at the same time; each of the base shell units 1 can also be arranged along different directions, so a single connecting shell unit 2 is connected to different second protruding portions 112 at the same time. The continuous bottom surface 3 is composed of the connecting bottom surface 21 and the base bottom surface 17 commonly. The connecting shell unit 2 has a height H2, and the height H2 is less than the height H1 of the base shell unit 1.

The base shell units 1 and the connecting shell units 2 are integrally formed, and are formed by a 3D printing process, but not limited to the above. For instance, the base shell units 1 and the connecting shell units 2 can also be processed by computer numerical control (CNC), and the continuous bottom surface 3 made of the connecting bottom surface 21 and the base bottom surface 17 is served as the appearance surface, so there is no need to provide an additional covering housing.

To sum up, by means that the base shell units and the connecting shell units are integrally formed, so the overall strength can be provided by the base shell units and the connecting shell units, respectively, and there is no need to provide an additional covering housing. Therefore, the thickness of the central housing of the foldable electronic device of the present disclosure can be reduced to less than 10 mm, and the central housing has sufficient strength.

What is claimed is:

1. A central housing of a foldable electronic device for pivotally connecting at least one first pivoting module and at least one second pivoting module, the central housing of the foldable electronic device comprising:

at least two base shell units, each of the base shell units including a body block, a track block, at least one first inner arc-shaped slider and at least one second inner arc-shaped slider, wherein the track block extends outward from a side of the body block along a first direction, the first inner arc-shaped sliders and the second inner arc-shaped sliders are respectively formed on the body block at intervals from each other, the first pivoting module pivots relative to the body block via the first inner arc-shaped sliders, and the second pivoting module pivots relative to the body block via the second inner arc-shaped sliders; and at least one connecting shell unit connected to any two of the base shell units, wherein the base shell units and the connecting shell unit are integrally formed, wherein the body block has a first protruding portion and a second protruding portion spaced apart from each other, the second protruding portion is located between the first protruding portion and the track block and is adjacent to the track block, the connecting shell unit is connected to a side of the first protruding portion away from the second protruding portion or is connected to a side of the second protruding portion away from the first protruding portion, and the track blocks are respectively formed on the connecting shell unit.

2. The central housing of the foldable electronic device of claim 1, wherein each of the first protruding portions has a first left surface and a first right surface, each of the second protruding portions has a second left surface and a second right surface, the first left surface correspondingly faces the second left surface, and the first right surface correspondingly faces the second right surface, wherein the first inner arc-shaped sliders extend outward from the first left surface and the second left surface respectively and correspond to each other, and the second inner arc-shaped sliders extend outward from the first right surface and the second right surface respectively and correspond to each other.

3. The central housing of the foldable electronic device of claim 2, wherein each of the base shell units further includes two axial holes, and the axial holes are respectively recessed on the second protruding portion along a first axis and a second axis parallel to the first direction.

4. The central housing of the foldable electronic device of claim 3, wherein each of the base shell units further includes a track groove, and the track groove penetrates through the track block.

5. The central housing of the foldable electronic device of claim 4, wherein each of the track blocks has a track section and two wing sections, the wing sections respectively extend outward from opposite sides of the corresponding track section, and the track groove is correspondingly located in the track section.

6. The central housing of the foldable electronic device of claim 5, wherein a thickness of each of the track sections is greater than a thickness of the corresponding wing section.

7. The central housing of the foldable electronic device of claim 1, wherein the connecting shell unit and the base shell units are formed by a 3D printing process.

8. The central housing of the foldable electronic device of claim 7, further comprising a continuous bottom surface, wherein each of the base shell units further includes a base bottom surface, the connecting shell unit includes a connecting bottom surface, and the base bottom surfaces and the connecting bottom surface are connected to each other to jointly form the continuous bottom surface.

9. The central housing of the foldable electronic device of claim 7, wherein the connecting shell unit has a roughly U-shaped cross section.

10. The central housing of the foldable electronic device of claim 7, wherein each of the base shell units further includes a screw lock hole.

11. The central housing of the foldable electronic device of claim 7, wherein a height of the connecting shell unit is less than a height of any of the base shell units.

* * * * *